United States Patent [19]
Stoll

[11] Patent Number: 4,549,248
[45] Date of Patent: Oct. 22, 1985

[54] ELECTRO-FLUIDIC CIRCUIT BOARD ASSEMBLY WITH FLUID DUCTS AND ELECTRICAL CONNECTIONS

[76] Inventor: Kurt Stoll, Lenzhalde 72, 7300 Esslingen, Fed. Rep. of Germany

[21] Appl. No.: 542,214

[22] Filed: Oct. 14, 1983

[30] Foreign Application Priority Data

Oct. 20, 1982 [DE] Fed. Rep. of Germany ....... 3238750

[51] Int. Cl.[4] ....... H05K 7/02

[52] U.S. Cl. ....... 361/400; 137/884

[58] Field of Search ....... 361/380, 382, 385, 388, 361/389, 412, 426, 429, 400, 403, 331; 165/104.33, 104.34; 137/884, 596.17, 269; 339/15, 16 R

[56] References Cited

U.S. PATENT DOCUMENTS

| | | | |
|---|---|---|---|
| 3,389,305 | 6/1968 | Bond | 361/382 |
| 3,536,875 | 10/1970 | Allen | 200/81 R |
| 3,845,258 | 10/1974 | Bruels | 200/81.5 |
| 4,053,725 | 10/1977 | Kramer | 200/81 R |
| 4,093,329 | 6/1978 | Ashill, III | 137/269 |
| 4,095,863 | 6/1978 | Hardin | 137/269 |
| 4,095,864 | 6/1978 | Hardin | 137/269 |

FOREIGN PATENT DOCUMENTS

| | | | |
|---|---|---|---|
| 0767413 | 8/1979 | U.S.S.R. | 137/884 |

*Primary Examiner*—Reinhard J. Eisenzopf
*Assistant Examiner*—Gregory D. Thompson
*Attorney, Agent, or Firm*—McGlew and Tuttle

[57] ABSTRACT

A circuit board having electrical and fluid control components thereon is made up of a board member with ducts formed therein running from fluid plug terminals to ports in a component support face of the circuit board where they are joined up with inlet and outlet ports of the fluid components. An electrical plug connector for the separate, electrically controlled components has a direction of plugging that is normal to the component support or mounting face.

7 Claims, 4 Drawing Figures

ELECTRO-FLUIDIC CIRCUIT BOARD ASSEMBLY WITH FLUID DUCTS AND ELECTRICAL CONNECTIONS

BACKGROUND OF THE INVENTION

The present invention relates to a circuit board having a board body fitted with electrical components and fluid controlling or controlled components (herein named "fluid components") and to a connector having in-line electrical and fluid terminals pointing in a common direction.

DESCRIPTION OF THE PRIOR ART

Such circuit boards may be used for electrical-pneumatic controls with a board member in the form of a printed circuit board fitted with the electronic components. Furthermore, the pneumatic components, as for example solenoids, and pneumatic plug terminals, are connected on the circuit board using screws. By pushing the circuit card or board into a part of an apparatus designed therefor and having electrical plug contact terminals for functioning with the electrical plug contact terminals on an edge of the circuit board, which for their part are joined up with the fluid terminal plugs connected on the circuit board, it is possible for the electrical and fluid connections to and from the circuit board to be produced.

For joining up the fluid components with the fluid terminals on the circuit card, and for joining them with each other, flexible pipe connections have been so far used in the art, whose ends are slipped over nozzles of the fluid terminals or of the fluid components as the case may be.

The putting together of the fluid components on such a prior art design of circuit card is for this reason likely to be very slow work. Furthermore, the different pieces of connection pipe will extend from the circuit card so that the cards have to be fixed in place well clear of each other to make certain that there is no chance of any of the connection pipes being pulled off by chance on plugging a circuit card in place.

SUMMARY OF THE INVENTION

One purpose or object of the present invention is that of so designing a circuit board or card of the sort noted hereinbefore that the fluid components may be fixed in place more simply thereon.

A still further purpose of the invention is to make it possible for a number of such cards of the sort in question, to be placed nearer to each other without any danger of damaging the ducts of such a board or card.

For effecting this and further purposes of the invention the card body has a number of connection ducts within it, each running from one of said fluid terminals to one of a number of ports at separate mounting points for separate fluid components in a mounting face on the board.

In the circuit card of the present invention the different fluid ducts are made part of the board member so that the same may be looked upon as having the function of a sort of circuit board made with a duct connection system that is much like the printed wiring of a printed circuit board but is different thereto only inasfar as it has a fluid conducting and switching function in place of an electrical one, on which the fluid components only have to be mounted. This can be done quite simply since it is possible for the desired fluid connections between a given component and the terminals to be made on the component mounting face without any connection hoses being needed.

In the case of the circuit card of the present invention the system of connections of the different ducts is fixed right from the time the circuit card is produced without any chance of them being changed or positioned erroneously later. Furthermore, the ducts take up very little space and are well safeguarded right inside the card or board member. In practice more than 50% less space is needed.

In one further possible development of the invention, the board is in the form of a laminated structure with at least two board members, the inner connection ducts are in the form of channels in the interface between one board and the other or next board and the channels are joined up, by way of through holes in the boards, with the mounting face, such through holes having a direction component normal to the plane of the board.

This outgrowth of the invention makes it possible for simple molds to be used for manufacturing the different single board members with a number of different ducts in different planes of the board body.

In keeping with a further idea on which the invention is based, the board member is made of hard foam material, at least in the part thereof forming the component mounting face. This makes it very simple for the fluid components to be sealed on the face simply by placing them in contact therewith inasfar as the hard foam material will be somewhat bent thereby and a fluid tight joint will be produced. Furthermore, if such hard foam material is used, the fluid components may be fixed directly on the mounting face by using screws, as for example self-tapping ones, for which pilot holes will have been drilled in the board beforehand.

Within the general framework of the present invention, it is possible for the board member and the fluid components to have plug terminals, working together with each other, and having a plugging direction normal to the mounting face. This then makes it possible for the separate fluid components that have electrical control terminals thereon, to be positioned on the component mounting face in a single plugging operation and the fluid connections will then all be produced at the same time. When they are so put into position the components will be kept firstly in place by the electrical terminals for the time being until they are then able to be fixed in position by fastening means such as screws. Such screwing in position is in fact made simpler because of the supporting effect of the electrical terminals.

The plug terminals of the fluid components may be placed running out to the side past the components themselves while the fixed plug terminals are placed on the board member the right distance to the side clear of the positions of mounting of the components. This makes is possible to see that the electrical connection wires and the fluid connection ducts are kept separate from each other, this being of value in connection with simple assembly and production and furthermore when it comes to looking for errors in the system.

The board may furthermore have first positive locking means functioning with second matching positive locking means as part of a circuit board housing. Such a housing may have at least one mounting position for a further such circuit board. The housing may have further locking means on its outer side for use with matching positive locking means in a hollow of the housing.

Such further developments of the design are generally to make it simpler for a single circuit board or a number of such circuit boards to be put in place in a hollow or socket and give a useful effect in this respect.

In fact, when the housing is made with the further mounting position for a further circuit board, one such board having mostly electrical components may be housed in the housing in addition to a circuit board mainly fitted with fluid components. The two boards then function as a single unit, making it specially simple to come across any errors or damage. Boards that are no longer in working order thus may be simply replaced.

An account will now be given of one working example of the invention using the Figures herein.

DESCRIPTION OF THE PREFERRED EMBODIMENT

Figure 1:
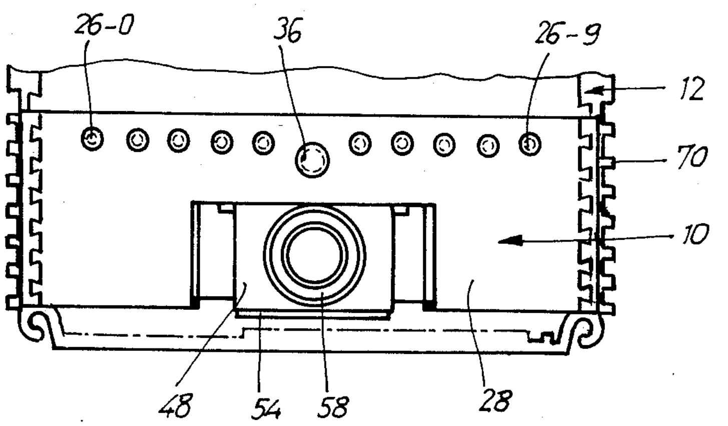
FIG. 1 is an end-on view of a circuit board having electrical and fluid controlling components therein, looking in the direction of plugging.

In the Figures the reader will see a circuit board generally numbered 10, which is slidable into and out of a housing 12. One half of the housing 12 is shown in FIG. 1.

Figure 4:
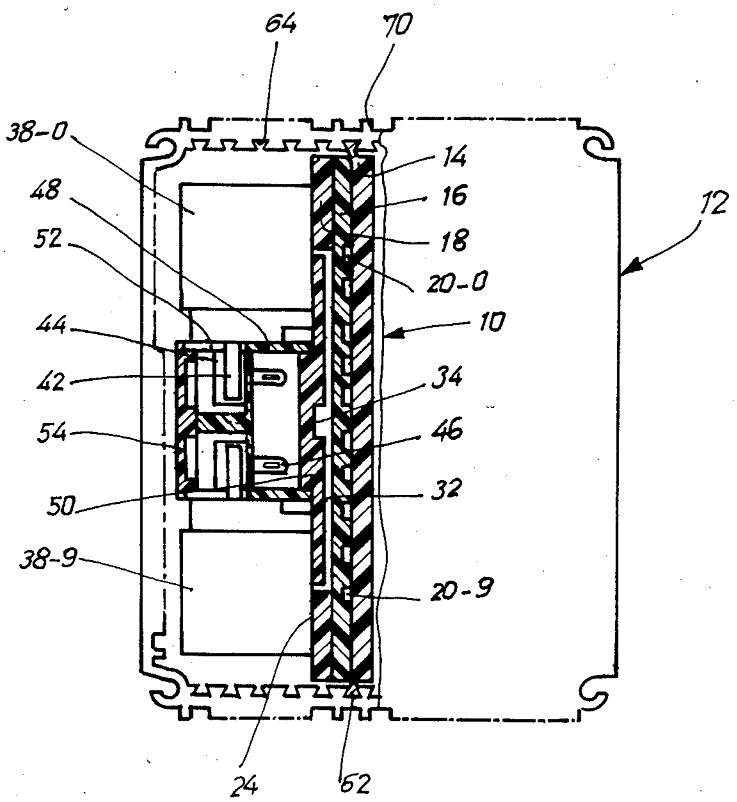
FIG. 4 is a cross-section through the circuit card of FIG. 2, taken on line 4—4.

The plate-like circuit board 10 as shown in FIG. 4, is made up of three board members 14, 16 and 18 placed one one top of the other. The board members are made of hard foam material and are joined together by adhesive, for example. In the face or interface (to be seen on the right in FIG. 4) of the board member 16, surface channels or outlet ducts 20-0 to 20-9 are formed. Each channel 20-0 to 20-9 opens, at one end into an outlet or power port 22 (see FIG. 2) in a free face, forming a component mounting face 24, of the board member 18. The other end of each of the surface channels 20-0 to 20-9 are joined respectively to a different one of ten fluid plug terminals or spigots 26-0 to 26-9, supported and forming part of an in-line terminal assembly 28. Each of the channels 20-0 to 20-9 is closed at its side by board member 14 and forms a fluid duct.

Furthermore, there are ten inlet ports 30 opening at the component mounting face 24. Ports 30 are joined, by way of surface channels 32 in the side face of the board member 18 (one of which is visible in FIG. 4) with a further channel 34, running the length of the board 18. The channel 34 together with the limiting face of the board member 16 makes up an inlet duct that is joined to a plug terminal 36 (FIG. 1) for the supply of fluid under pressure, the terminal 36 being joined to the in-line terminal assembly 28.

The different channels are placed symmetrically in relation to a lengthwise middle plane of the board members 14, 16 and 18 so that one each side of the said middle plane there are five mounting positions or points for fluid components. In the present example these components are taken to be 2/2 solenoid valves 38-0 to 38-9. Each valve or component 38-0 to 38-9 has a flat mating surface through which ports 30 and 22 extend and which is securely pressed against the mounting face 24 directly.

The solenoid valves 38 are kept in place directly on the assembly made up of the boards 14 to 18 by way of self tapping screws 40 so that the inlet and outlet ports of the valves, placed in the surface next to the board assembly, are air-tightly joined to the outlet and inlet ports 30 and 22.

In their side face next to the middle of the circuit board, the solenoid valves 38 in each case have two vertically spaced electrical knife contact terminals 42 (FIG. 4) plugged in between contact springs 44 therefor. The contact springs 44 are so designed that the solenoid valves may be moved by a certain amount in a direction normal to the plane of FIG. 2, toward the mounting face 24, the knife contacts 42 then automatically taking up positions between the contact springs 44 when such mounting motion takes place. In this way the solenoid valves 38 are kept in place even before driving home the screws so that the screwing operation is in fact made simpler.

Each of the contact springs 44 has a soldering lug 46 formed thereon for connection with electrical wiring.

The contact springs 44 are positioned in a plug housing 48 by a molding operation, that is to say they are locked in place by molding the resin of the housing 48 around them. The housing 48 is seated on a raised fin 50 running along the board 18 in the lengthwise direction thereon. The housing 48 has slots 52, through which the knife contacts 42 may be freely moved into position. The complete assembly made up of the contact springs 44 is shut off by a cover 54, that for its part is fixed on the plug housing 48 by way of screws 56. The different electrical conductors (not shown) running to the contact springs 44 are joined up with an electrical plug connector 58 with a cable 60. Springs 44 and their housing form electrical connection means for the board 10.

As may be better seen from FIG. 4, the board 14 has side wings 62 that are locked into dovetail grooves 64 in the housing 12. To keep the circuit board 10 locked in the housing 12 there are sprags 66 (see FIG. 2) acting as locking means, that are screwed in place by screws 68 on the in-line terminal assembly 28 and take effect on the housing 12.

Figure 3:
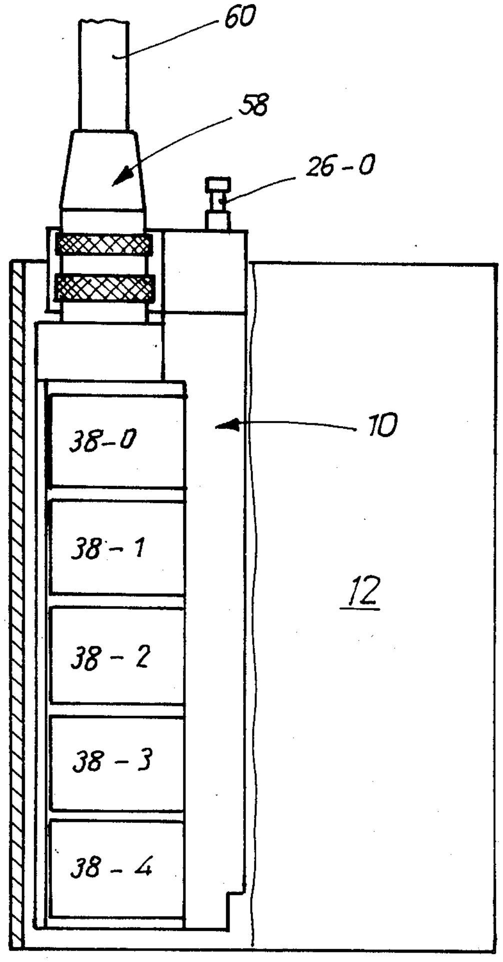
FIG. 3 is a view from the side of the circuit card seen in FIGS. 1 and 2 with part of the housing cut away.

As the reader will more specially be able to see from FIGS. 3 and 4, the housing 12 is so large in size that there is still room in it for a second circuit board. This circuit board may be designed on the same lines as the circuit board 10, or it may be fitted with mostly electronic components for controlling the different solenoid valves 38.

As will be seen from the Figures, the housing 12 has dovetail section slots 64 on its inner side, while its outer faces are ribbed at 70 so that the unit made up of the circuit boards and the housing 12 may be slipped into an enclosure therefor.

Figure 2:
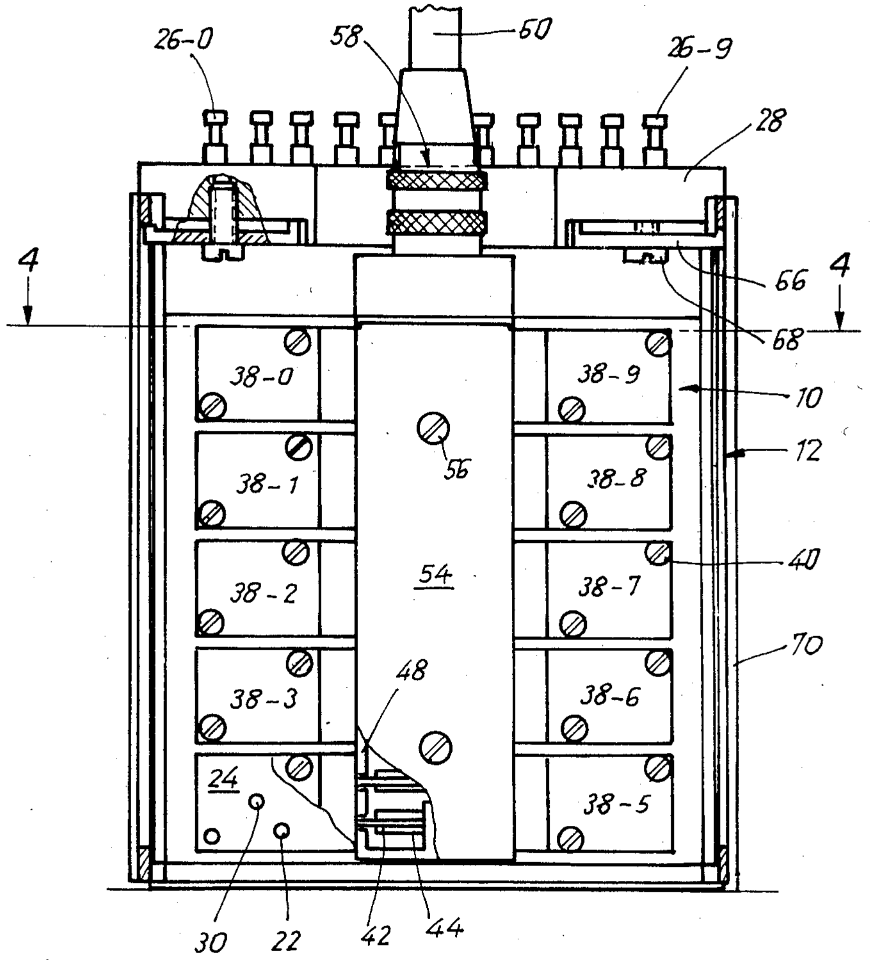
FIG. 2 is a front view of the circuit board or card of FIG. 1.

At its lower end shown in FIG. 2 the housing 12 may be closed by a cover (not shown in the Figures) which is kept in place by adhesive or by a snap-on locking system so that the housing 12, and the circuit boards as a unit therein, are safeguarded against dust and moisture.

I claim:

1. An electro-fluidic circuit board assembly comprising:

a plate-like circuit board (10) including a plurality of inlet ducts (32,34) and a plurality of outlet ducts (20) defined therein, said circuit board having at least a part made of rigid foam plastic with a mounting face (24) lying in a first plane and containing a first open end (30,22) of each of said inlet and outlet ducts, said ducts being adapted to convey a fluid to and from said mounting face;

electrical connector means connected to said circuit board and including a plurality of spring plug connectors (44) each structured to permit engagement of a knife contact and for allowing motion of a knife contact toward and away from said mounting face in a direction transverse to said first plane, while maintaining an electrical connection between the knife contact and a spring plug connector;

a plurality of electro-fluidic components (38) each having a flat mating surface containing an inlet port and an outlet port, each component connected to said circuit board with its mating surface engaged directly against said mounting surface (24) of said circuit board (10) so that engagement of said mating surface of each component with said mounting face hermetically seals said ports of each component with respective open ends of said ducts, said first open ends of said inlet and outlet ducts being positioned to engage respectively with inlet and outlet ports of said component, each component having a second surface lying in a second plane transverse to said first plane, a pair of knife contacts (42) extending from said second surface of each component and into engagement with one of said spring plug connectors (44) whereby each component can move parallel to said second plane toward and away from said mounting face while maintaining contact between its knife contacts and spring plug connectors engaged with its knife contact; and at least one self-tapping screw (40) connecting each component (38) to said circuit board.

2. A circuit board assembly according to claim 1, wherein said electrical connector means comprises a connector housing (48) defining a space and connected to said circuit board, said housing extending outwardly from said mounting face (24) of said circuit board, said spring plug connector (44) at least partly encased by portions of said connector housing, said connector housing having a slot (52) receiving each knife contact and sufficiently wide in the direction of said second plane permitting relative movement between each knife contact and said connector housing.

3. A circuit board assembly according to claim 2, wherein said circuit board includes a fin (50) extending beyond said first plane toward said connectors (44), said connector housing engaged on opposite sides of said fin.

4. A circuit board assembly according to claim 3, including a cover (54) connected to said connector housing closing said space of said connector housing.

5. A circuit board assembly according to claim 3, wherein said circuit board (10) comprises a plurality of board members, at least two of said board members having a plurality of channel grooves defined therein with said board members connected to close off sides of said channels, said channels defining said inlet and outlet ducts.

6. A circuit board assembly according to claim 5, wherein said members are each made of rigid foam material for sealing each duct and for sealing said first surface of each component to said mounting face (24) of said circuit board (10).

7. A circuit board assembly according to claim 6, including an outer housing (12) defining an inner space and including a plurality of parallel dove-tailed grooves (64), said circuit board (10) including a pair of opposite dove-tailed projections (62) each slidably engaged in one of said dove-tailed grooves (64) for engaging said circuit board and said components in said outer housing.

* * * * *